United States Patent
Ver Steeg

(10) Patent No.: US 8,239,739 B2
(45) Date of Patent: Aug. 7, 2012

(54) SYSTEMS AND METHODS OF DEFERRED ERROR RECOVERY

(75) Inventor: William C. Ver Steeg, Alpharetta, GA (US)

(73) Assignee: Cisco Technology, Inc., San Jose, CA (US)

(*) Notice: Subject to any disclaimer, the term of this patent is extended or adjusted under 35 U.S.C. 154(b) by 848 days.

(21) Appl. No.: 12/364,950

(22) Filed: Feb. 3, 2009

(65) Prior Publication Data

US 2010/0199152 A1   Aug. 5, 2010

(51) Int. Cl.
*H03M 13/00* (2006.01)

(52) U.S. Cl. .................... 714/776; 714/746

(58) Field of Classification Search ............... 714/746, 714/776
See application file for complete search history.

(56) References Cited

U.S. PATENT DOCUMENTS

| | | | |
|---|---|---|---|
| 5,594,509 A | 1/1997 | Florin et al. | |
| 5,633,683 A | 5/1997 | Rosengren et al. | |
| 5,790,546 A | 8/1998 | Dobbins et al. | |
| 5,838,994 A | 11/1998 | Valizadeh | |
| 5,847,765 A * | 12/1998 | Sanpei | 375/240.05 |
| 5,913,031 A | 6/1999 | Blanchard | |
| 5,949,795 A | 9/1999 | Moroney et al. | |
| 6,118,498 A | 9/2000 | Reitmeier | |
| 6,252,849 B1 | 6/2001 | Rom et al. | |
| 6,453,471 B1 | 9/2002 | Klosterman | |
| 6,529,475 B1 | 3/2003 | Wan et al. | |
| 6,990,074 B2 | 1/2006 | Wan et al. | |
| 7,058,015 B1 | 6/2006 | Wetherall et al. | |
| 7,065,779 B1 | 6/2006 | Crocker et al. | |
| 7,113,484 B1 | 9/2006 | Chapman et al. | |
| 7,158,479 B1 | 1/2007 | Noble | |
| 7,174,661 B2 | 2/2007 | Briscoe | |
| 7,313,627 B1 | 12/2007 | Noble | |
| 7,333,434 B2 | 2/2008 | Grenot et al. | |
| 7,356,605 B1 | 4/2008 | Khouri et al. | |
| 7,404,003 B1 | 7/2008 | Noble | |
| 7,477,653 B2 | 1/2009 | Smith et al. | |
| 7,496,676 B2 | 2/2009 | Kryeziu | |
| 7,706,274 B2 | 4/2010 | Koning et al. | |
| 7,886,073 B2 | 2/2011 | Gahm et al. | |
| 8,015,310 B2 | 9/2011 | Gahm et al. | |

(Continued)

FOREIGN PATENT DOCUMENTS

EP   0 714 192   5/1996

(Continued)

OTHER PUBLICATIONS

Natalie Degrande et al., "Increasing the User Perceived Quality for IPTV Services," IEEE Communications Magazine, Feb. 2008, pp. 94-100.

(Continued)

*Primary Examiner* — Sam Rizk
(74) *Attorney, Agent, or Firm* — Merchant & Gould

(57) ABSTRACT

Systems and methods of deferred error recovery in a digital home communications terminal are disclosed. One such method comprises: receiving packets at a delivery rate; filling a decoder buffer from frames in the received packets while bypassing an error recovery buffer; after the level of the decoder buffer reaches an underrun threshold, decoding from the frames in the decoder buffer; and after beginning to decode, filling the error recovery buffer from the received packets and filling the decoder buffer from frames output from the error recovery buffer.

20 Claims, 6 Drawing Sheets

U.S. PATENT DOCUMENTS

| | | | |
|---|---|---|---|
| 2001/0025378 A1 | 9/2001 | Sakamoto et al. | |
| 2002/0019853 A1 | 2/2002 | Vange et al. | |
| 2002/0181454 A1 | 12/2002 | Norman et al. | |
| 2002/0199203 A1 | 12/2002 | Duffy et al. | |
| 2003/0067872 A1 | 4/2003 | Harrell et al. | |
| 2003/0159143 A1 | 8/2003 | Chan | |
| 2003/0196211 A1 | 10/2003 | Chan | |
| 2003/0198184 A1 | 10/2003 | Huang et al. | |
| 2004/0133907 A1 | 7/2004 | Rodriguez et al. | |
| 2004/0228277 A1 | 11/2004 | Williams | |
| 2005/0027503 A1 | 2/2005 | Kumar et al. | |
| 2005/0165946 A1 | 7/2005 | Stephens | |
| 2005/0180415 A1 | 8/2005 | Cheung et al. | |
| 2005/0190781 A1 | 9/2005 | Green et al. | |
| 2006/0184973 A1 | 8/2006 | De Heer et al. | |
| 2006/0242240 A1 | 10/2006 | Parker et al. | |
| 2007/0033494 A1* | 2/2007 | Wenger et al. | 714/776 |
| 2007/0106782 A1 | 5/2007 | Ver Steeg et al. | |
| 2007/0107023 A1 | 5/2007 | Ver Steeg et al. | |
| 2007/0107024 A1 | 5/2007 | Ver Steeg et al. | |
| 2007/0121629 A1 | 5/2007 | Cuijpers et al. | |
| 2007/0130393 A1 | 6/2007 | Ver Steeg | |
| 2007/0277210 A1 | 11/2007 | Yousef | |
| 2008/0022320 A1 | 1/2008 | Ver Steeg | |
| 2008/0109692 A1 | 5/2008 | Ver Steeg | |
| 2008/0192839 A1 | 8/2008 | Gahm et al. | |
| 2008/0244667 A1 | 10/2008 | Osborne | |
| 2008/0244679 A1 | 10/2008 | Sukumar et al. | |
| 2009/0031342 A1 | 1/2009 | Ver Steeg et al. | |
| 2009/0031392 A1 | 1/2009 | Ver Steeg et al. | |
| 2009/0077255 A1 | 3/2009 | Smith et al. | |
| 2009/0259763 A1 | 10/2009 | Karlsson | |
| 2010/0036962 A1 | 2/2010 | Gahm et al. | |
| 2010/0036963 A1 | 2/2010 | Gahm et al. | |

FOREIGN PATENT DOCUMENTS

| | | |
|---|---|---|
| EP | 1294193 | 3/2003 |
| WO | WO 99/09741 | 2/1999 |
| WO | WO 2005/020556 | 3/2005 |
| WO | WO 2006/019505 | 2/2006 |
| WO | WO 2007/044562 A1 | 4/2007 |

OTHER PUBLICATIONS

International Search Report dated Jan. 28, 2010 Application No. PCT/US2009/053130.
U.S. Office Action dated May 27, 2010 U.S. Appl. No. 12/188,718.
U.S. Office Action dated Jun. 25, 2010 U.S. Appl. No. 12/188,724.
Sherer, et al., "Appendix A Low Bandwidth Low Latency Channel change," U.S. Appl. No. 60/719,146, filed Sep. 21, 2005.
Joshua B. Gahm, "Systems and Methods of Adaptive Playout of Delayed Media Streams," U.S. Appl. No. 12/188,724, filed Aug. 8, 2008.
Joshua B. Gahm, "Systems and Methods of Reducing Media Stream Delay," U.S. Appl. No. 12/188,718, filed Aug. 8, 2008.
U.S. Final Office Action dated Dec. 6, 2010 U.S. Appl. No. 12/188,724.

* cited by examiner

SYSTEMS AND METHODS OF DEFERRED ERROR RECOVERY

CROSS REFERENCE TO RELATED APPLICATIONS

Not applicable.

FIELD OF THE DISCLOSURE

The present disclosure relates to digital media delivery, and more specifically, to systems and methods of deferred error recovery.

BACKGROUND

A growing number of consumers now have high-speed, or broadband, connections to the Internet in their homes. The increased bandwidth provided by these broadband connections allows the delivery of digital television, video, and multimedia services to home consumers. These services are transported over the network as program streams. At the customer premises, a digital media receiver decodes one or more media streams. The digital media receiver also generates a signal for display by a television or monitor. A switch to a different program stream results in some amount of delay before the new stream can be decoded and displayed.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure.

DETAILED DESCRIPTION

Overview

The embodiments disclosed herein provide systems and methods of deferred error recovery. One such embodiment is a method comprising: receiving packets at a delivery rate; filling a decoder buffer from frames in the received packets while bypassing an error recovery buffer; after the level of the decoder buffer reaches an underrun threshold, decoding from the frames in the decoder buffer; and after beginning to decode, filling the error recovery buffer from the received packets and filling the decoder buffer from frames output from the error recovery buffer.

Example Embodiments

Figure 1:
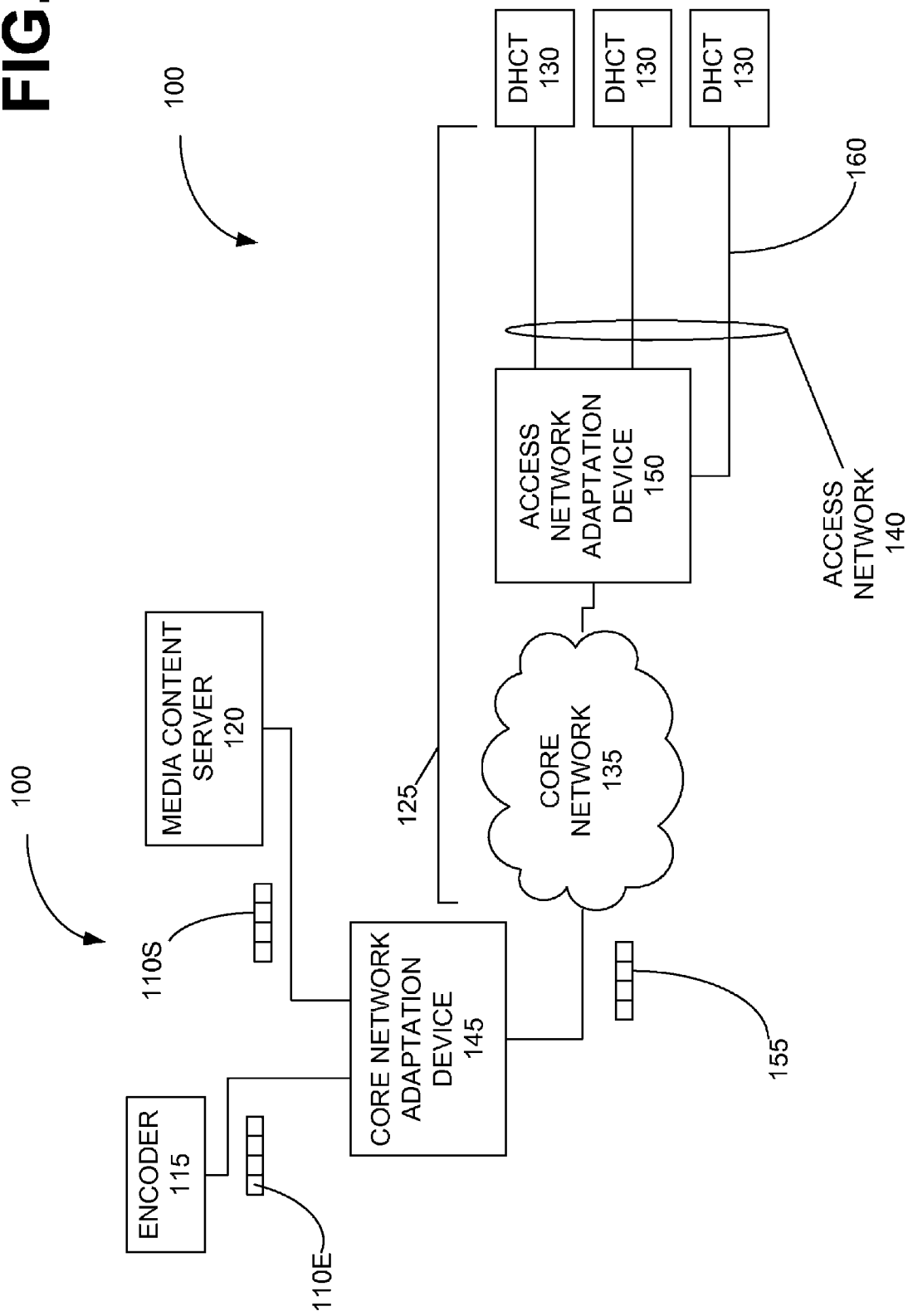
FIG. 1 is a block diagram of an environment in which one embodiment of a system and method for deferred error recovery is located.

FIG. 1 is a block diagram of an environment in which one embodiment of a system and method for deferred error recovery is located. System 100 delivers various digital services to subscribers using the Internet Protocol (IP). Such services include, but are not limited to, television programming, video-on-demand, pay-per-view, music, Internet access, shopping, and voice (e.g., telephone). Services are delivered over one or more digital media streams 110. In this disclosure, the term "media stream" refers to a stream that includes video frames, audio frames, voice, data, multimedia, or any combination thereof. Common encoding formats for media streams 110 include MPEG-2, MPEG-4, and VC-1. In some environments, the encoded media stream represents a single program, and thus contains a video and an audio stream multiplexed together into a single program transport stream (SPTS).

Media streams 110 may be provided from various sources. In the example environment of FIG. 1, media stream 110E is provided by an encoder 115 which encodes an analog signal from a media content source, such as a cable network or an on-air television station, and media stream 110S is provided from a digital media content server 120. Other sources of media streams 110 should be familiar to a person of ordinary skill in the art, and are intended to be within the scope of this disclosure. Various of these encoders and servers may be located at a facility known as a "head end" which is operated by a service provider (e.g., cable television company).

Media streams 110 are delivered over network 125 to one or more digital media receivers 130. In the example environment of FIG. 1, network 125 includes a core network 135 and an access network 140. Because these networks typically include components using different technologies, a core network adaptation device 145 prepares media streams 110 for transport over core network 135. The details of this adaptation depend on the type of network. However, the adaptation for core network 135 generally involves combining program streams into a multiplexed transport stream, encapsulating the transport stream into packets, and using broadcast, multicast, or unicast addressing for the packets as appropriate.

The result is a media packet stream 155 which is suitable for transport across core network 135 and which contains multiple media streams 110, each containing a program. A person of ordinary skill in the art should be familiar with the concept and practice of encapsulating information into packets, and with addressing techniques, so these features will not be discussed further in this disclosure. In one embodiment, MPEG Transport Stream (TS) packets are encapsulated within layer-4 Universal Datagram Protocol (UDP) packets, which are then encapsulated in Internet Protocol (IP) packets. In another embodiment, the MPEG TS packets are encapsulated within real-time transport (RTP) packets, which are in turn encapsulated within UDP and IP packets. In another embodiment, VC-1 streams are used rather than MPEG streams.

After adaptation by core network adaptation device 145, media packet stream 155 is transported over core network 135 and delivered to access network 140. An access network adaptation device 150 prepares media packet stream 155 for travel over access network 140. The details of the adaptation for access network 140 vary depending on the type of subscriber connection 160 and on the subscriber equipment. In general, access network adaptation device 150 converts between the lower layer protocols used by access network 140 (e.g., high speed Ethernet) and the protocols used on subscriber connection 160 (e.g., DSL, HFC, Fiber to the Home). Thus, access network adaptation device 150 may be implemented as a cable modem termination system (CMTS) in an HFC environment, or a DSL access multiplexer (DSLAM) in a DSL environment. Some embodiments of access network adaptation device 150 also perform encapsulation, de-encapsulation, or both (as when converting from one packet format to another). Some embodiments act as a multiplexer to combine additional streams such as a voice stream or a data stream.

After adaptation by access network adaptation device 150, media packet stream 155 travels over subscriber connection 160 to digital media receiver 130. Digital media receiver 130 converts the stream of media packets into a standard analog or digital video signal, which is supplied to a display (e.g., a television or computer monitor) for viewing by the customer. Some embodiments of digital media receiver 130 also provide interactive features, such as an electronic program guide (EPG), Web browser, or DVR (digital video recorder) functionality. In some embodiments, digital media receiver 130 takes the form of a set-top box. In others, digital media receiver 130 is implemented by a personal computer (PC). The term "digital media receiver" extends to other types of receivers that include the capability to receive and process compressed digital video streams. Examples of other types of receivers include: hand-held and/or mobile receivers that are coupled to a transmission channel which carries media packet streams; video-services-enabled receivers (VSERs); and other electronic devices such as media players.

Standard video compression techniques use variable length encoding. As a result, the amount of the data output from an encoder varies according to factors such as a change in a scene or the magnitude of motion in an image input from an external information source. On the decoder side, this varying amount of encoded data leads to a variable decode rate. A buffer, or a series of buffers, in digital media receiver 130 is used to decouple the variable decode rate from the steady receive rate. Both overflow and underflow of buffer levels should be avoided.

Buffer management is particularly important when digital media receiver 130 receives a new stream (e.g., as a result of changing channels, or a VOD request for a trick mode stream). In such cases, the buffered data from the previous channel depletes, and the buffer(s) begin to fill again with data from the newly selected channel. The use of such buffers can add delay to the channel change process.

In particular, conventional systems avoid underflow by deferring the decode and display of images until a digital media receiver decoder buffer reaches an underflow or underrun threshold. Various mechanisms have been defined to reduce the time it takes to fill the decode buffer. One such mechanism is described in U.S. Ser. No. 11/164,147, filed Nov. 11, 2005 ("Expedited Digital Signal Encoding" to Ver Steeg, now Publication No. 2007/0130393). This patent application is fully incorporated herein by reference and made a part hereof.

Some conventional systems use additional buffers to implement error recovery. In such conventional systems, data flows through an error recovery buffer before entering the decoder buffer. Typically, if an error in the data stream (such as a missing or corrupt packet) is detected then Forward Error Correction (FEC) is applied or a re-transmit request is transmitted from the digital media receiver 130, to an upstream network data element, which retransmits the errored or missing data. Packets therefore remain in the error recovery buffer until the error recovery logic determines that the packets are no longer needed for error repair or recovery.

Various embodiments of logic for deferring error recovery 300, residing in digital media receiver 130, implement one or more inventive mechanisms which reduce delay related to error recovery by bypassing the error recovery buffer, thus allowing decoding to start earlier. These mechanisms will now be described.

Figure 2:
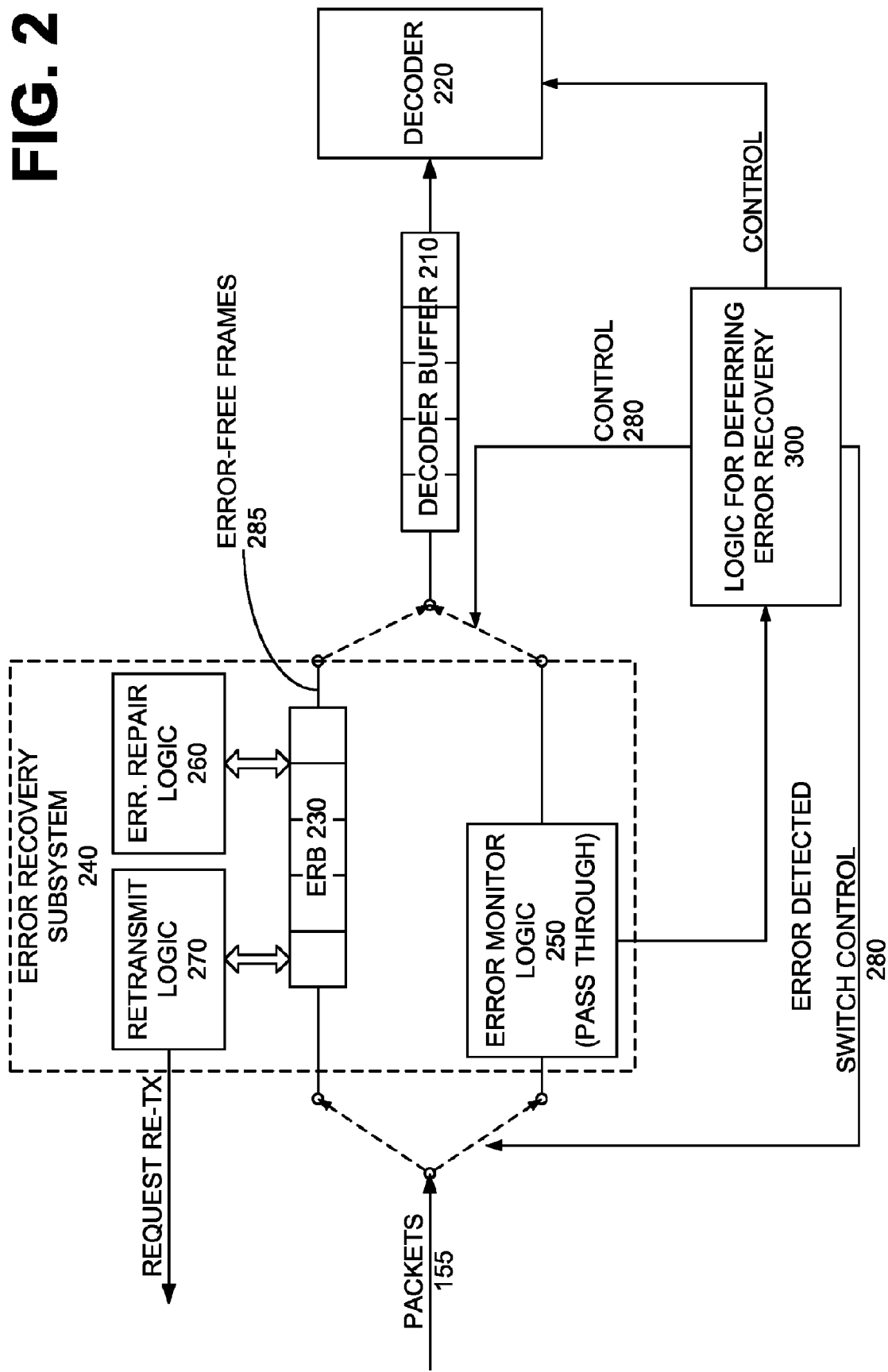
FIG. 2 is a diagram illustrating various data paths between some of the logical components of the digital media receiver from FIG. 1.

FIG. 2 is a diagram illustrating various data paths between some of the logical components of digital media receiver 130. Digital media receiver 130 receives stream 155 containing media packets from network 125 (FIG. 1). A decoder buffer 210 stores frames carried within media packets and feeds these frames to decoder 220. In some embodiments, a depacketizer (not shown) removes the frames encapsulated within the packets so that frames rather than packets are provided to decoder buffer 210. The frames from decoder buffer 210 are provided to decoder 220 according to one or more control signals or mechanisms (e.g., buffer full, buffer reaches particular thresholds, etc.). This buffer arrangement decouples frame reception from frame decoding, and allows the decode (output) rate of decoder 220 to be different than the arrival or delivery rate of packet stream 155. This is useful because in many compression/decompression schemes, the decode rate is variable.

Under some conditions (to be described later), received frames flow into an error recovery buffer (ERB) 230, which in turn fills decoder buffer 210. Error recovery buffer 230, in conjunction with error recovery subsystem 240, allows digital media receiver 130 to recover from errored or missing packets in stream 155. Error monitor logic 250 monitors stream 155 to detect errored or missing packets. In some embodiments, the packets in stream 155 include error recovery information (e.g., Forward Error Correction or FEC codes), which allows error repair logic 260 to repair errored packets in Error recovery buffer 230. In other embodiments, retransmit logic 270 uses information within the received packets (e.g., sequence numbers) to request retransmission of errored or missing packets from an upstream component (e.g., an error recovery server at the headend).

When conventional error recovery techniques are used, frames always flow into error recovery buffer 230 before entering decoder buffer 210. In contrast, using the inventive techniques described the frames bypass error recovery buffer 230. In the example embodiment of FIG. 2, logic 300 controls the data path, to couple incoming media packet stream 155 to error recovery buffer 230 or to decoder buffer 210. In this embodiment, logic 300 also makes and breaks the data path between error recovery buffer 230 and decoder buffer 210, using control signals 280.

In the embodiment of FIG. 2, error recovery buffer 230 is filled from media packet stream 155. In other embodiments, error recovery buffer 230 is filled from a separate error repair stream (not shown).

Control of decoder 220, of error recovery buffer 230, and the resulting behavior of digital media receiver 130, will be discussed in more detail in connection with FIG. 3. Although the data paths are shown in FIG. 2 as switches, this is intended to describe how the data flows between buffers; any interface could be used, and actual switches are not required. Also, although the term "control signal" is used, any interface could be used and a physical signal is not required.

Figure 3:
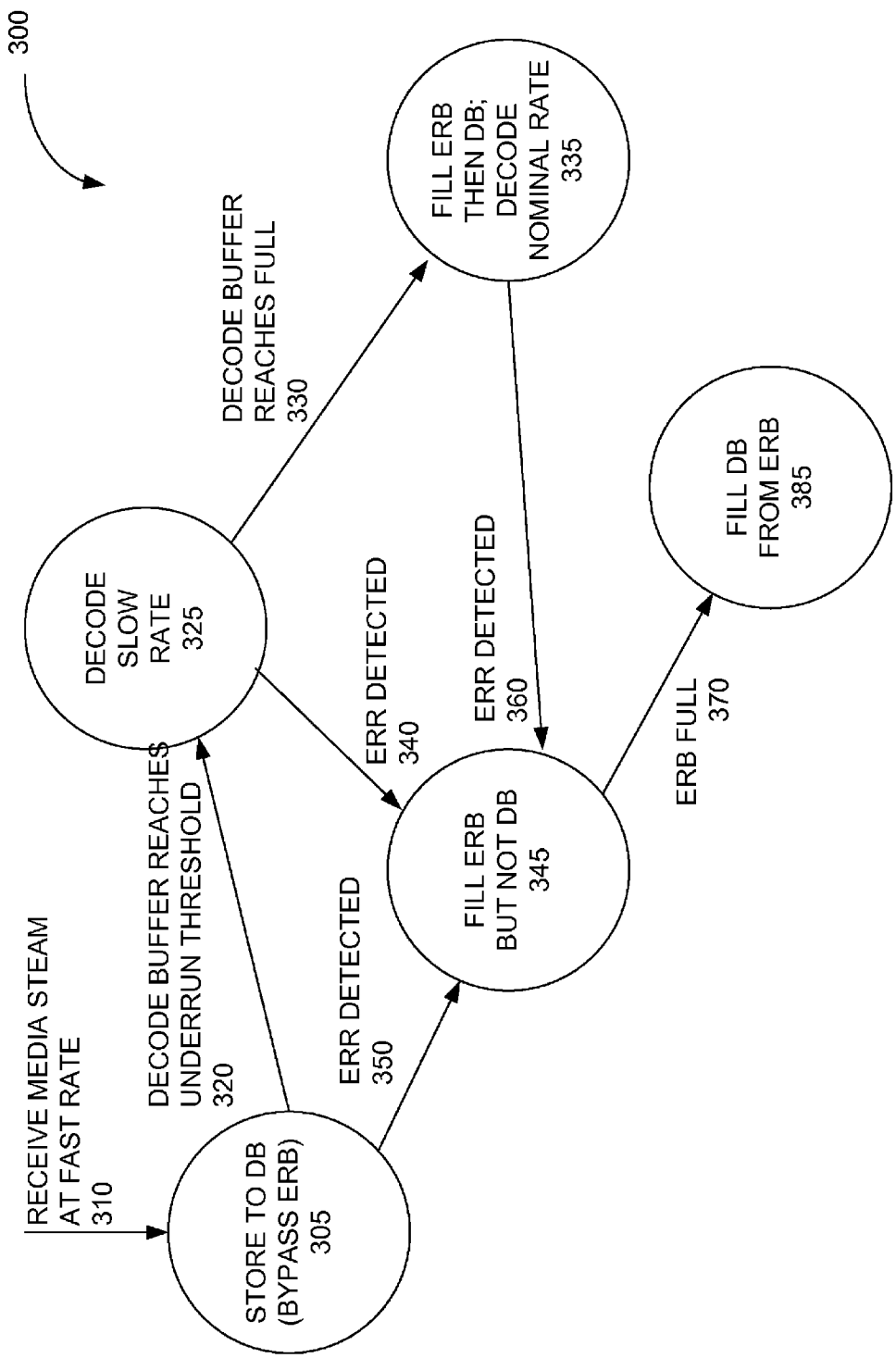
FIG. 3 is a state diagram illustrating operation of one embodiment of logic for deferring error recovery from FIG. 1.

FIG. 3 is a state diagram illustrating operation of one embodiment of logic for deferring error recovery 300, introduced in FIG. 2. Persons of ordinary skill in the art should appreciate that the state machines described herein can be implemented as software (instructions executing on a processor), or by hardware logic, or by a combination thereof. From an initial state (not shown), logic 300 transitions into state 305 upon receipt of a media packet stream 155 (event 310) that is delivered at faster than the natural or nominal rate (i.e., the rate at which the stream is normally delivered through the network). This faster delivery is sometimes referred to as a "burst", and may be in response to a channel change at digital media receiver 130. Upon this transition to state 305, logic 300 fills decoder buffer 210 while bypassing error recovery buffer 230. In some embodiments, this behavior is implemented by directing logic 300 to couple media packet stream 155 to decoder buffer 210, and to uncouple decoder buffer 210 from error recovery buffer 230.

Decoder 220 does not fetch and decode frames from decoder buffer 210 while in state 305 so the occupancy level of decoder buffer 210 increases as packets are received. Upon decoder buffer 210 reaching a pre-determined underrun threshold (event 320), logic 300 transitions into state 325, and decoder 220 starts decoding frames from decoder buffer 210, at a rate which is slower than the rate of delivery of media packet stream 155 to digital media receiver 130. In some embodiments, this slower rate is equal to the natural or nominal rate. While in state 325, decoder 220 continues to decode frames from decoder buffer 210 at this same rate.

Upon decoder buffer 210 reaching full or almost full (event 330), logic 300 transitions into state 335. With this transition, logic 300 begins filling error recovery buffer 230 and then decoder buffer 210, in series. In some embodiments, this serial fill behavior is implemented by directing logic 300 to couple media packet stream 155 to error recovery buffer 230, and to couple error recovery buffer 230 to decoder buffer 210. Upon entering state 335, decoder 220 sets its decode rate to match the delivery rate of media packet stream 155. Since the decode rate in previous state 325 is slower than the delivery rate, this decode rate change in state 335 represents an increase from state 325.

Once in state 335, digital media receiver 130 has reached a steady state. Packets in media packet stream 155 continue to flow into error recovery buffer 230, and from there, error-free frames continue to flow into decoder buffer 210. Decoder 220 continues to decode at a natural rate that matches the delivery rate of media packet stream 155.

As described earlier, logic for deferring error recovery 300 transitions from state 325 to state 335 when decoder buffer 210 reaches full or almost full. If instead an error in media packet stream 155 is detected (event 340) (e.g., by error monitor logic 250), logic 300 transitions from state 325 to state 345. With this transition to state 345, logic 300 begins filling error recovery buffer 230 from media packet stream 155; frames are no longer added to decoder buffer 210. State 345 is also reached when an error is detected while in state 305 (transition to state 345 on event 350). State 345 is also reached from state 335 (transition on event 360). In some embodiments, while in state 345 decoder 210 ceases to decode new frames and instead presents a previously decode frame multiple times. In such embodiments, decoding of buffered frames begins again after exiting state 345.

Since error recovery buffer 230 isn't drained into decoder buffer 210 while in state 345, the occupancy level of error recovery buffer 230 increases as packets are received. Upon error recovery buffer 230 reaching full or almost full (event 370), logic 300 transitions from state 345 to state 385, and begins filling decoder buffer 210 from error recovery buffer 230. Decoder 220 also sets its decode rate to match the delivery rate of media packet stream 155. State 385 is a steady state: packets in media packet stream 155 continue to flow into error recovery buffer 230, and from there, error-free frames continue to flow into decoder buffer 210. Decoder 220 continues to decode at a natural rate that matches the delivery rate of media packet stream 155.

Figure 4:
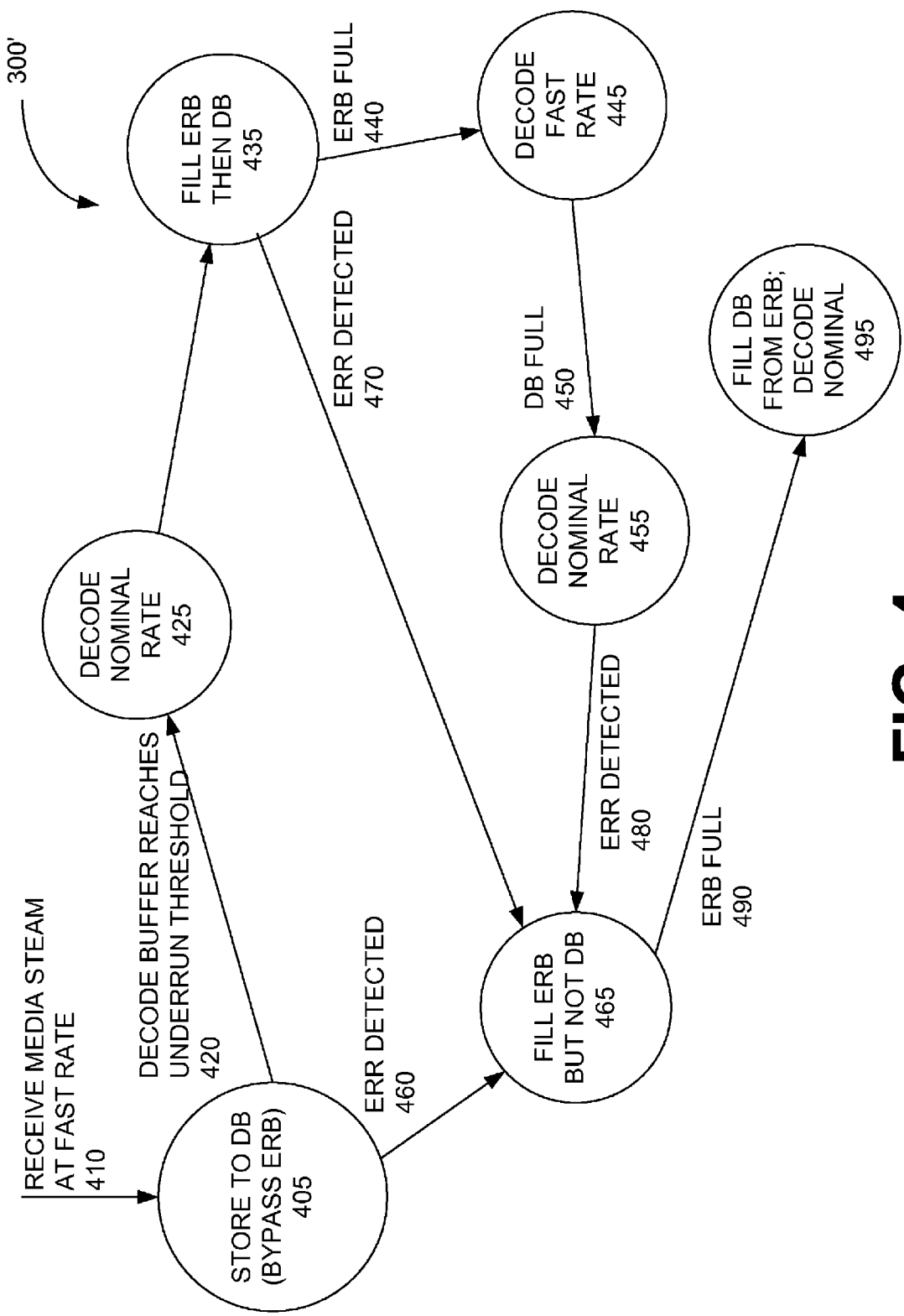
FIG. 4 is a state diagram illustrating operation of another embodiment of logic for deferring error recovery from FIG. 1.

FIG. 4 is a state diagram illustrating operation of another embodiment of logic for deferring error recovery 300'. From an initial state (not shown), logic 300' transitions into state 405 upon receipt of a media packet stream 155 (event 410) that is delivered at faster than the natural or nominal rate (i.e., the rate at which the data normally flows through the core network). Upon this transition, logic 300' fills decoder buffer 210 while bypassing error recovery buffer 230. In some embodiments, logic 300' implements this behavior by coupling media packet stream 155 to decoder buffer 210, and uncoupling decoder buffer 210 from error recovery buffer 230.

Decoder 220 does not fetch and decode frames from decoder buffer 210 while in state 405 so the occupancy level of decoder buffer 210 increases as packets are received. Upon decoder buffer 210 reaching a pre-determined underrun threshold (event 420), logic 300' transitions into state 425, and decoder 220 starts decoding frames from decoder buffer 210, at the natural or nominal rate (slower than the rate of delivery of media packet stream 155 to digital media receiver 130). Logic 300' then transitions unconditionally to state 435 and begins filling error recovery buffer 230 and then decoder buffer 210, in series. In some embodiments, logic 300' implements this serial fill behavior by coupling media packet stream 155 to error recovery buffer 230, and coupling error recovery buffer 230 to decoder buffer 210. The decode rate remains at the natural or nominal rate.

Since media packet stream 155 is delivered at a faster than natural rate, the occupancy level of error recovery buffer 230 and of decoder buffer 210 increases as packets are received. Upon error recovery buffer 230 reaching full or almost full (event 440), logic 300' transitions from state 435 to state 445. Decoder 220 sets its decode rate to be faster than the delivery rate of media packet stream 155 (which represents an increase over the decode rate in state 435). Decoder buffer 210, filling from error recovery buffer 230, eventually reaches full or almost full (event 450). On this event, logic 300' transitions from state 445 to state 455, and the decoder rate is set to the natural or nominal rate (which represents a decrease from the decode rate in state 445). State 455 is a steady state: packets in media packet stream 155 continue to flow into error recovery buffer 230 at the natural or nominal rate, and from there, error-free frames continue to flow into decoder buffer 210. Decoder 220 continues to decode at a natural rate that matches the delivery rate of media packet stream 155.

As described earlier, logic 300' transitions from state 405 to state 425 when decoder buffer 210 reaches a pre-determined underrun threshold. If instead an error in media packet stream 155 is detected (event 460) (e.g., by error monitor logic 250), logic 300' transitions from state 405 to state 465. With this transition to state 465, logic 300' begins filling error recovery buffer 230 from media packet stream 155; frames are no longer added to decoder buffer 210. State 465 is also reached when error recovery buffer 230 an error is detected while in state 435 (transition to state 465 on event 470) or from state 455 (transition to 465 on event 480). In some embodiments, while in state 465 decoder 210 ceases to decode new frames and instead presents a previously decode frame multiple times. In such embodiments, decoding of buffered frames begins again after exiting state 465.

Since error recovery buffer 230 is not drained into decoder buffer 210 while in state 465, the occupancy level of error recovery buffer 230 increases as packets are received. Upon error recovery buffer 230 reaching full or almost full (event 490), logic 300' transitions from state 465 to state 495, and begins filling decoder buffer 210 from error recovery buffer 230. Decoder 220 also sets its decode rate to match the delivery rate of media packet stream 155. State 495 is a steady state: packets in media packet stream 155 continue to flow into error recovery buffer 230, and from there, error-free frames continue to flow into decoder buffer 210. Decoder 220 continues to decode at a natural rate that matches the delivery rate of media packet stream 155.

Figure 5:
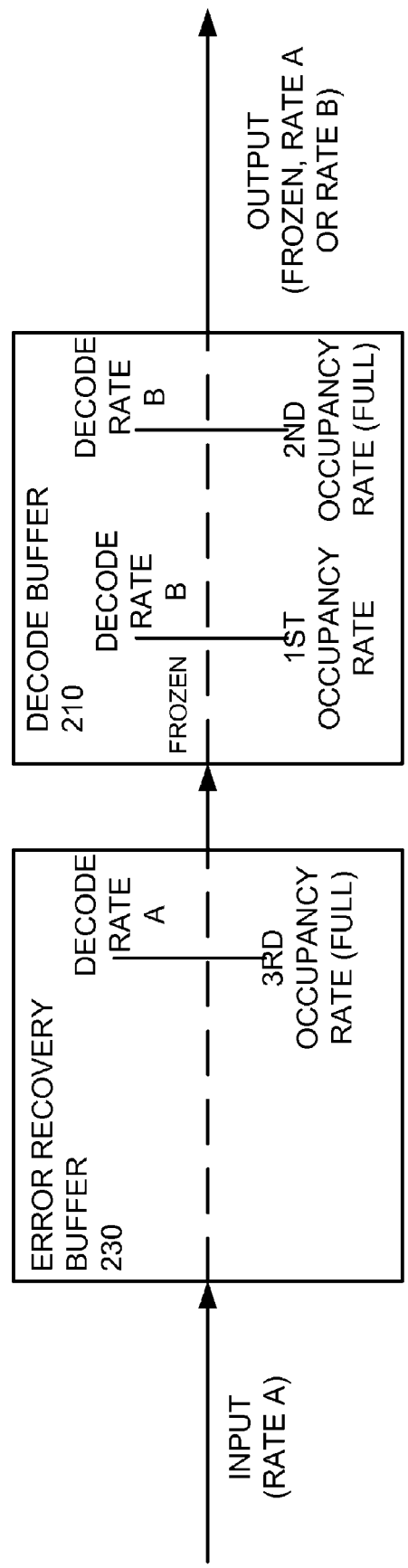
FIG. 5 illustrates occupancy levels and corresponding data flow rates for the decoder buffer and error recovery buffer from FIG. 2.

FIG. 5 illustrates occupancy levels and corresponding data flow rates for decoder buffer 210 from error recovery buffer 230. For purposes of this illustration, buffer occupancy increases from the left side of the buffers 210, 230 to the right side of the buffers 210, 230. Therefore, the varying output data flow from the buffers 210, 230 is illustrated in conjunction with the varying occupancy level of the buffers 210, 230. Media packet stream 155 is input to decoder buffer 210 through error recovery buffer 230 at a natural stream rate or a rate faster than the natural stream rate, for example Rate A. Output from the error recovery buffer 230 is frozen or is output at a rate lower than the natural stream rate, such as Rate B, by error recovery subsystem 240 such that the buffer reaches a first occupancy level. If the output is frozen, then error recovery subsystem 240 begins outputting the data at a rate lower than the natural stream rate, such as Rate B. At an intermediate occupancy level (not shown), the data stream could change from a unicast stream to a multicast stream, remain a unicast stream, or remain a multicast stream. When decoder buffer 210 has substantially filled, the data output rate remains at a rate lower than Rate A (e.g., Rate B) until error recovery buffer 230 fills, at which time the output from decoder buffer 210 increases from Rate B to the input rate, Rate A. Rate A could be equal to the natural stream rate.

For example, digital media receiver 130 can request a unicast data stream from upstream network components. The unicast data stream is sent at Rate A, for example a natural data rate of six megabytes per second, to error recovery buffer 230 in digital media receiver 130. If an error is detected in the data stream during a channel change operation (e.g. switching from unicast to multicast, etc.) filling of the error recovery buffer and subsequent FEC repair or retransmission is deferred as compared to conventional techniques. Instead, the output rate from decoder buffer 210 is slowed to a rate less than Rate A, or is frozen. Once decoder buffer 210 has begun to fill and reached a key frame (e.g., an intra-coded frame), a first occupancy level has been reached. Error recovery buffer 230 begins to output data to decoder buffer 210 at Rate B, which is for example four megabytes per second (a rate less than Rate A). In one embodiment, when decoder buffer 210 has reached an intermediate occupancy level, digital media receiver 130 requests that a multicast data flow from an upstream network component (e.g., a channel change server), which allows frames to be sent from to digital media receiver 130 at a faster rate. Output from decoder buffer 210 remains at the lower rate (e.g., Rate B) until decoder buffer 210 fills and while error recovery buffer 230 fills with data. Once error recovery buffer 230 is substantially full, a third occupancy level has been reached. The data output rate from decoder buffer 210 is increased to Rate C, which is equal to Rate A, the natural data rate.

Figure 6:
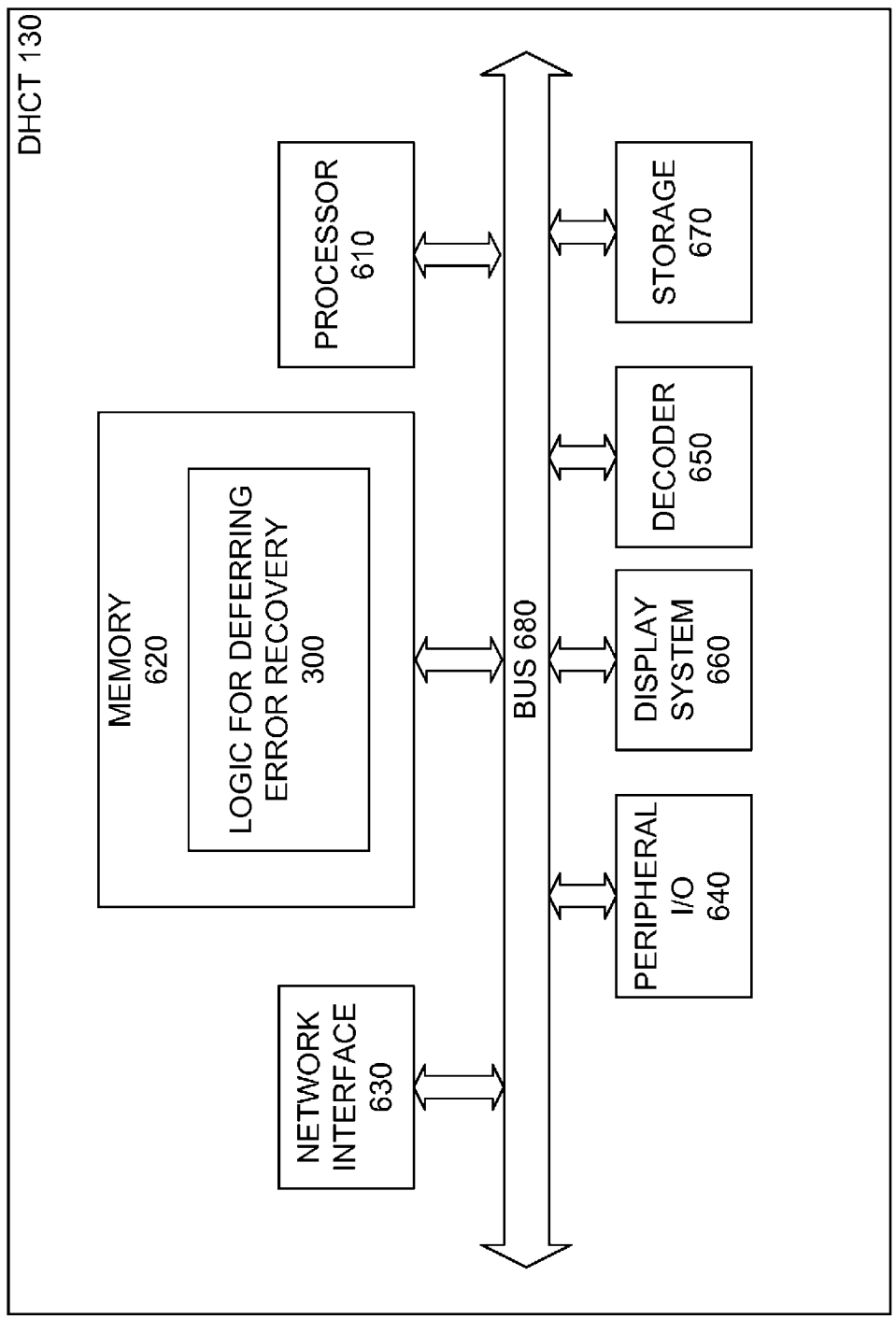
FIG. 6 is a hardware block diagram of one embodiment of the digital media receiver from FIG. 1.

FIG. 6 is a hardware block diagram of one embodiment of digital media receiver 130. Digital media receiver 130 contains a number of components that are well known in the computer arts, including a processor 610, memory 620, a network interface 630, a peripheral input output (I/O) interface 640, a decoder 650, and a display system 660. Some embodiments also include a storage device 670 (e.g., nonvolatile memory or a disk drive). These components are coupled via a bus 680. Omitted from FIG. 6 are a number of conventional components that are unnecessary to explain the operation of digital media receiver 130.

Peripheral I/O interface 640 provides input and output signals, for example, user inputs from a remote control or front panel buttons or a keyboard, and outputs such as LEDs or LCD on the front panel. Network interface 630 receives streams, decoder 210 decodes an incoming video stream into a stream of decoded video frames. In some embodiments, decoder 210 also performs demultiplexing of multiple streams (e.g., audio and video). In some embodiments, decoder 210 also decrypts the encoded stream. Display system 660 converts the decoded video frames into a video signal for display by a computer monitor or a television.

As described above, digital media receiver 130 receives digital video streams via network interface 630. In some embodiments, this is a local area network (LAN) interface or a wide area network (WAN) interface such as the Internet. In other embodiments, network interface 630 interfaces to a radio frequency (RF) network, and so may include a tuner/demodulator (not shown) which processes digital signals received over the RF network.

Logic for deferring error recovery 300 may be implemented as hardware logic, as software (i.e., instructions executing on processor 610, or any combination thereof. Processor 610 includes, but is not limited to, a microprocessor, a microcontroller, a network processor, a reconfigurable processor, and an extensible processor. Logic for deferring error recovery 300 may be implemented in hardware, including, but not limited to, a programmable logic device (PLD), programmable gate array (PGA), field programmable gate array (FPGA), an application-specific integrated circuit (ASIC), a system on chip (SoC), and a system in package (SiP). Furthermore, logic for deferring error recovery 300 may be implemented as a combination of processor-executable software and hardware logic.

Logic for deferring error recovery 300 may also take the form of executable instructions embodied on any computer-readable medium suitable for use by a processor-containing computer system. In the context of this disclosure, a "computer-readable medium" can be any means that can contain or store the program for use by, or in connection with, the computer system. The computer readable medium can be, for example but not limited to, a system or that is based on electronic, magnetic, optical, electromagnetic, infrared, or semiconductor technology.

Specific examples of a computer-readable medium using electronic technology would include (but are not limited to) the following: random access memory (RAM); read-only memory (ROM); and erasable programmable read-only memory (EPROM or Flash memory). A specific example using magnetic technology includes (but is not limited to) a portable computer diskette. Specific examples using optical technology include (but are not limited to) compact disk (CD) and digital video disk (DVD).

The software components illustrated herein are abstractions chosen to illustrate how functionality is partitioned among components in some embodiments of various systems and methods of deferred error recovery disclosed herein. Other divisions of functionality are also possible, and these other possibilities are intended to be within the scope of this disclosure. Furthermore, to the extent that software components are described in terms of specific data structures (e.g., arrays, lists, flags, pointers, collections, etc.), other data structures providing similar functionality can be used instead.

Software components are described herein in terms of code and data, rather than with reference to a particular hardware device executing that code. Furthermore, to the extent that system and methods are described in object-oriented terms, there is no requirement that the systems and methods be implemented in an object-oriented language. Rather, the systems and methods can be implemented in any programming language, and executed on any hardware platform.

Software components referred to herein include executable code that is packaged, for example, as a standalone executable file, a library, a shared library, a loadable module, a driver, or an assembly, as well as interpreted code that is packaged, for example, as a class. In general, the components used by the systems and methods for deferred error recovery are described herein in terms of code and data, rather than with reference to a particular hardware device executing that code. Furthermore, the systems and methods can be implemented in any programming language, and executed on any hardware platform.

The flow charts, messaging diagrams, state diagrams, and/or data flow diagrams herein provide examples of the operation of systems and methods of deferred error recovery, according to embodiments disclosed herein. Alternatively, these diagrams may be viewed as depicting actions of an example of a method implemented by logic for systems and methods of deferred error recovery. Blocks in these diagrams represent procedures, functions, modules, or portions of code which include one or more executable instructions for implementing logical functions or steps in the process. Alternate implementations are also included within the scope of the disclosure. In these alternate implementations, functions may be executed out of order from that shown or discussed, including substantially concurrently or in reverse order, depending on the functionality involved. The foregoing description has been presented for purposes of illustration and description. It is not intended to be exhaustive or to limit the disclosure to the precise forms disclosed. Obvious modifications or variations are possible in light of the above teachings. The implementations discussed, however, were chosen and described to illustrate the principles of the disclosure and its practical application to thereby enable one of ordinary skill in the art to utilize the disclosure in various implementations and with various modifications as are suited to the particular use contemplated. All such modifications and variation are within the scope of the disclosure as determined by the appended claims when interpreted in accordance with the breadth to which they are fairly and legally entitled.

What is claimed is:

1. A method comprising:
   receiving packets at a delivery rate in a media packet stream;
   filling a decoder buffer from frames in the received packets by coupling the media packet stream to the decoder buffer while bypassing an error recovery buffer by decoupling the error recovery buffer from the decoder buffer;
   after the level of the decoder buffer reaches an underrun threshold, decoding from the frames in the decoder buffer at a rate slower than the delivery rate; and
   after beginning to decode, filling the error recovery buffer from the received packets by decoupling the media stream from the decoder buffer and coupling to the error recovery buffer, and filling the decoder buffer from frames output from the error recovery buffer by coupling the decoder buffer to the error recovery buffer in series.

2. The method of claim 1, further comprising:
   continuing to decode from the frames in the decoder buffer once the error recovery buffer has started filling.

3. The method of claim 1, wherein the filling the error recovery buffer from the received packets and filling the decoder buffer from frames output from the error recovery buffer is performed responsive to the level of the decoder buffer reaching a fill threshold.

4. The method of claim 1, wherein the filling the error recovery buffer from the received packets and filling the decoder buffer from frames output from the error recovery buffer is performed responsive to the beginning to decode and regardless of whether the decoder buffer has reached a fill threshold.

5. The method of claim 1, wherein the delivery rate is faster than a normal rate at which the stream is delivered through a core network, and the decoding after the level of the decoder buffer reaches an underrun threshold occurs at a decode rate slower than the normal rate.

6. The method of claim 1, wherein the decoding after the level of the decoder buffer reaches an underrun threshold occurs at a decode rate equal to the delivery rate.

7. The method of claim 1, wherein the delivery rate is faster than a normal rate at which the stream is delivered through a core network, and wherein the decoding after the level of the decoder buffer reaches an underrun threshold occurs at a decode rate equal to the normal rate.

8. The method of claim 1, further comprising:
   responsive to the level in the error recovery buffer reaching full, decoding at a decode rate faster than the delivery rate.

9. The method of claim 8, further comprising:
   responsive to the level in the error recovery buffer reaching full, decoding at a decode rate faster than the first delivery rate; and
   responsive to the level in the decoder buffer reaching full after the level in the error recovery buffer reaches full, decoding at a decode rate equal to the delivery rate.

10. The method of claim 1, further comprising:
    responsive to detecting an errored packet in the media stream, filling the error recovery buffer from the received packets while bypassing the decoder buffer; and
    responsive to the error recovery buffer reaching a predetermined fill threshold, filling the decoder buffer from the error recovery buffer.

11. A device comprising:
    a decoder;
    a decoder buffer;
    memory;
    a processor configured by instructions retrieved from the memory to:
      receive packets at a delivery rate in a media packet stream;
      fill the decoder buffer from frames in the received packets by coupling the media packet stream to the decoder buffer while bypassing an error recovery buffer by decoupling the error recovery buffer from the decoder buffer; and
      after beginning to decode, filling the error recovery buffer from the received packets by decoupling the media stream from the decoder buffer and coupling to the error recovery buffer, and filling the decoder buffer from frames output from the error recovery buffer by coupling the decoder buffer to the error recovery buffer in series;
    the decoder configured to:
      begin decoding from the frames in the decoder buffer after the level of the decoder buffer reaches an underrun threshold at a rate slower than the delivery rate;
      continue to decode from the frames in the decoder buffer once the error recovery buffer has started filling.

12. The device of claim 11, wherein the filling the error recovery buffer from the received packets and filling the decoder buffer from frames output from the error recovery buffer is performed responsive to the level of the decoder buffer reaching a fill threshold.

13. The device of claim 11, wherein the filling the error recovery buffer from the received packets and filling the decoder buffer from frames output from the error recovery buffer is performed responsive to the beginning to decode and regardless of whether the decoder buffer has reached a fill threshold.

14. The device of claim 11, wherein the delivery rate is faster than a normal rate at which the stream is delivered through a core network, and the decoding after the level of the decoder buffer reaches an underrun threshold occurs at a decode rate slower than the normal rate.

15. The device of claim 11, wherein the delivery rate is faster than a normal rate at which the stream is delivered through a core network, and wherein the decoding after the level of the decoder buffer reaches an underrun threshold occurs at a decode rate equal to the normal rate.

16. The device of claim 11, the decoder further configured to:
  responsive to the level in the error recovery buffer reaching full, decode at a decode rate faster than the delivery rate; and
  responsive to the level in the decoder buffer reaching full after the level in the error recovery buffer reaches full, decoding at a decode rate equal to the delivery rate.

17. A method comprising:
  receiving packets in a media stream at a delivery rate;
  filling a decoder buffer from frames in the received packets by coupling the media packet stream to the decoder buffer while bypassing an error recovery buffer by decoupling the error recovery buffer from the decoder buffer;
  after the level of the decoder buffer reaches an underrun threshold, decoding from the frames in the decoder buffer at a rate slower than the delivery rate;
  after beginning to decode, filling the error recovery buffer from the received packets by decoupling the media stream from the decoder buffer and coupling the error recovery buffer, and filling the decoder buffer from frames output from the error recovery buffer by coupling the decoder buffer to the error recovery buffer in series; and
  responsive to detecting an errored packet in the media stream, ceasing to decode and presenting a previously decoded frame multiple times.

18. The method of claim 17, further comprising:
  responsive to detecting the errored packet in the media stream, filling the error recovery buffer from the received packets while bypassing the decoder buffer.

19. The method of claim 17, further comprising:
  responsive to detecting the errored packet in the media stream, filling the error recovery buffer from the received packets while bypassing the decoder buffer; and
  responsive to the error recovery buffer reaching a predetermined fill threshold, filling the the decoder buffer from the error recovery buffer.

20. The method of claim 17, further comprising: after an errored packet is detected in the error recovery buffer and responsive to the level of the error recovery buffer reaching a predetermined fill threshold, filling the decoder buffer from frames output from the error recovery buffer and decoding at a decode rate equal to the first delivery rate.

* * * * *